US006677802B2

(12) United States Patent
Strom et al.

(10) Patent No.: US 6,677,802 B2
(45) Date of Patent: Jan. 13, 2004

(54) METHOD AND APPARATUS FOR BIASING BODY VOLTAGES

(75) Inventors: James D. Strom, Rochester, MN (US); Patrick L. Rosno, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/946,417

(22) Filed: Sep. 5, 2001

(65) Prior Publication Data

US 2003/0042968 A1 Mar. 6, 2003

(51) Int. Cl.[7] .............................................. H03K 3/01
(52) U.S. Cl. ....................................... 327/534; 327/537
(58) Field of Search ................................ 327/534, 530, 327/535, 537, 538, 540, 541, 543, 546, 581, 427, 434, 436; 323/315, 316

(56) References Cited

U.S. PATENT DOCUMENTS

| | | | | |
|---|---|---|---|---|
| 5,391,979 A | * | 2/1995 | Kajimoto et al. | 323/313 |
| 5,767,545 A | * | 6/1998 | Takahashi | 257/341 |
| 5,821,769 A | * | 10/1998 | Douseki | 326/34 |
| 6,075,404 A | * | 6/2000 | Shindoh et al. | 327/537 |
| 6,281,743 B1 | * | 8/2001 | Doyle | 327/539 |
| 6,323,724 B1 | * | 11/2001 | Uekubo | 327/538 |
| 6,362,612 B1 | * | 3/2002 | Harris | 323/312 |

* cited by examiner

Primary Examiner—Terry D. Cunningham
Assistant Examiner—Long Nguyen
(74) Attorney, Agent, or Firm—Arnall Golden Gregory LLP; Bryan W. Bockhop

(57) ABSTRACT

An apparatus for biasing a body voltage of a silicon-on-insulator transistor includes an operational amplifier that generates an output voltage that is proportional to the voltage difference between a desired gate-source threshold voltage and a reference voltage. A reference biasing transistor has a gate that is electrically coupled to the output. A reference mirror transistor has both a gate and a drain that are electrically coupled to the current source node, and also has a body that is electrically coupled to the drain of the reference biasing transistor. A device biasing transistor has a gate that is electrically coupled to the output voltage and has a drain that is electrically coupled to the body of the silicon-on-insulator transistor. The device biasing transistor maintains a voltage at the body of the silicon-on-insulator transistor so that it has a gate-source threshold voltage within a predetermined range of the desired gate-source threshold voltage.

12 Claims, 1 Drawing Sheet

METHOD AND APPARATUS FOR BIASING BODY VOLTAGES

BACKGROUND OF THE INVENTION

1. Field of the Invention

The present invention relates to electronic circuits and, more specifically, to a system for biasing body voltages in a silicon on insulator circuit.

2. Description of the Prior Art

In electronic semiconductors, silicon-on-insulator (SOI) structure is a technique for isolating complementary MOS (CMOS) transistors from a substrate. The principle is to establish a layer of insulating material (in general a silicon dioxide layer) not far away from the surface of a silicon substrate, thereby isolating a layer of substrate silicon from the main substrate body below. A CMOS transistor can then be fabricated on the isolated substrate silicon layer above the insulating layer, and hence the structure is called silicon-on-insulator. Since the area for fabricating the CMOS transistor is isolated from the substrate main body, certain conventional latch-up paths will be excluded. For example, conventional latch-up paths such as "source terminal to the substrate" and "well region to the substrate" no longer exist due to the isolation provided by this insulating layer. SOI CMOS devices often operate at higher speeds than do bulk CMOS devices. SOI CMOS architecture eliminates inherent parasitic circuit elements in bulk CMOS due to junction capacitances between adjacent components.

SOI devices are characterized by a thin layer of insulating material, also referred to as a buried oxide layer, that is sandwiched between a bulk substrate and the circuit elements of the device. Typically, no other layers of material are interposed between the SOI and the bulk substrate. In an SOI CMOS device, the circuit elements above the SOI are established by regions of a field oxide semiconductive layer which are doped as appropriate with N-type or P-type conductivity dopants. For example, for an N channel transistor, the field oxide layer will include a gate element disposed over a body region having a P-type dopant, with the body region being disposed between a source region and a drain region, each of which are doped with an N-type dopant.

The SOI structure can be fabricated using isolation by implanted oxygen (SIMOX) method, bonded wafer method or dielectric isolation (DI) method. The advantages of having a SOI structure, other than being capable of reducing parasitic bipolar effects of a CMOS transistor, include the ability to increase its immunity to soft errors caused by powerful alpha.-particles. Furthermore, since the permitted line width is smaller, the level of integration can be increased. In addition, since the number of masks necessary for fabricating a device for a SOI structure is fewer, the manufacturing process is very much simplified. The reduction of parasitic bipolar effects together with the reduction of device dimensions further boost the operational speed of the circuit.

In one illustrative example of an SOI device, an active device region is defined out of a silicon main body by a device isolating structure. A buried oxide layer is formed in the silicon main body and a P-type silicon substrate is formed above the buried oxide layer. Then a gate terminal, for example, of a MOS transistor, is formed above the P-type silicon substrate. Finally, N-type source region and drain region are formed on each side of the gate terminal.

In such an SOI device, the P-type silicon substrate is in a floating state. Therefore, unwanted current can easily flow between the drain region and the source region due to the transfer of electrons at the interface between the source region and the P-type silicon substrate. This is the so-called floating body effect, which affects the functionality of the device as well as lowering its reliability. Hence, a tie down voltage is often connected to the P-type silicon substrate in order to reduce the floating body effect. To accomplish this, an extension area is added above the SOI device region. There is usually a contact window above the extension area for supplying the necessary low tie down voltage to the P-type silicon substrate.

Complementary metal oxide semiconductor (CMOS) devices that are produced in mass quantities are referred to as "bulk" CMOS, because they include a semiconductive bulk substrate on which active or passive circuit elements are disposed. Recently, SOI CMOS devices have been introduced which consume less power than do bulk CMOS devices. Analog circuits require close matching to perform properly. With the move to SOI processes to gain speed and lower power, typical SOI circuits employ body contacts to minimize tracking error between devices that need to match.

Another technique used to minimize tracking error is to employ long channel devices. However, as SOI technology shrinks below 0.13 micron, SOI long channel devices become fully depleted. This causes an dramatic increase in body resistance, which decreases the effect of the body contact and increases tracking error. To make a body contact have a low resistance in these shrunken technologies, the channels are highly doped. This raises the gate-source threshold voltage ($V_T$) of the device, which causes power supply headroom problems in stacked circuits (which are prevalent in Analog circuit designs), thereby increasing noise variation.

Therefore, there is a need for a device that biases body voltages of silicon-on-insulator transistors to maintain the gate-source threshold voltages of the transistors within a predetermined range of a desired gate-source threshold voltage.

SUMMARY OF THE INVENTION

The invention biases the body voltages in SOI transistors to control $V_T$ and, thus, the gate-source voltage while using the gate-source voltage as feedback for devices. The invention improves matching and power supply headroom performance in analog and other circuits.

The disadvantages of the prior art are overcome by the present invention which, in one aspect, is an apparatus for biasing a body voltage of a silicon-on-insulator transistor having a gate and a body. An operational amplifier senses a voltage difference between a desired gate-source threshold voltage and a reference voltage at a reference current source node and generates an output voltage that is proportional to the voltage difference. A reference biasing transistor has a gate that is electrically coupled to the output voltage and has a drain. A reference mirror transistor has both a gate and a drain that are electrically coupled to the current source node. The reference mirror transistor also has a body that is electrically coupled to the drain of the reference biasing transistor. A device biasing transistor has a gate that is electrically coupled to the output voltage and has a drain that is electrically coupled to the body of the silicon-on-insulator transistor. The device biasing transistor maintains a voltage at the body of the silicon-on-insulator transistor so that the silicon-on-insulator transistor has a gate-source threshold voltage that is within a predetermined range of the desired gate-source threshold voltage.

In another aspect, the invention is an apparatus for biasing a device body so as to maintain a desired gate-source threshold voltage of a device. The device has a device gate, a device source, a device drain and a device body. The device also has a device gate-source threshold voltage. The device is driven by a reference current from a reference current node, which has a reference voltage. An operational amplifier is capable of generating an output voltage that is proportional to a voltage difference between the desired gate-source threshold voltage and the reference voltage. The operational amplifier has a first input and a second input. The first input is electrically coupled to the desired gate-source threshold voltage and the second input is electrically coupled to the reference current node.

At least two body biasing transistors, including a first body biasing transistor and a second body biasing transistor, each have a biasing transistor drain and a biasing transistor gate that is driven by the output voltage of the operational amplifier. Each of the body biasing transistors is capable of supplying a body biasing current that is proportional to the output voltage. The biasing transistor drain of the second body biasing transistor is electrically coupled to the device body. A reference transistor has a reference gate, a reference source, a reference drain and a reference body. The reference drain and the reference gate are electrically coupled to the reference current node. The reference body is electrically coupled to the body biasing drain of the first body biasing transistor. A first passive component is electrically coupled to the reference body and causes the reference body to have a reference body voltage that is proportional to the body biasing current so that the reference voltage is within a predetermined range of the desired gate-source threshold voltage. A second passive component is electrically coupled to the device body and causes the body to have a body voltage that is proportional to the body biasing current so that the device gate-source threshold voltage is within the predetermined range of the desired gate-source threshold voltage.

In yet another aspect, the invention is a method of biasing a body voltage of a device having a device gate-source threshold voltage. A voltage difference is sensed between a desired gate-source threshold voltage reference and a node voltage of a reference drain of a reference transistor, where the reference drain is electrically coupled to a reference gate of the reference transistor. A biasing current that is proportional to the voltage difference is sourced. A body biasing voltage that is proportional to the biasing current is generated and drives the body voltage of the device so that the device gate-source threshold voltage is within a predetermined range of the desired gate-source threshold voltage.

The embodiment disclosed herein is a current mirror. However the invention can be used in a wide variety of circuits.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
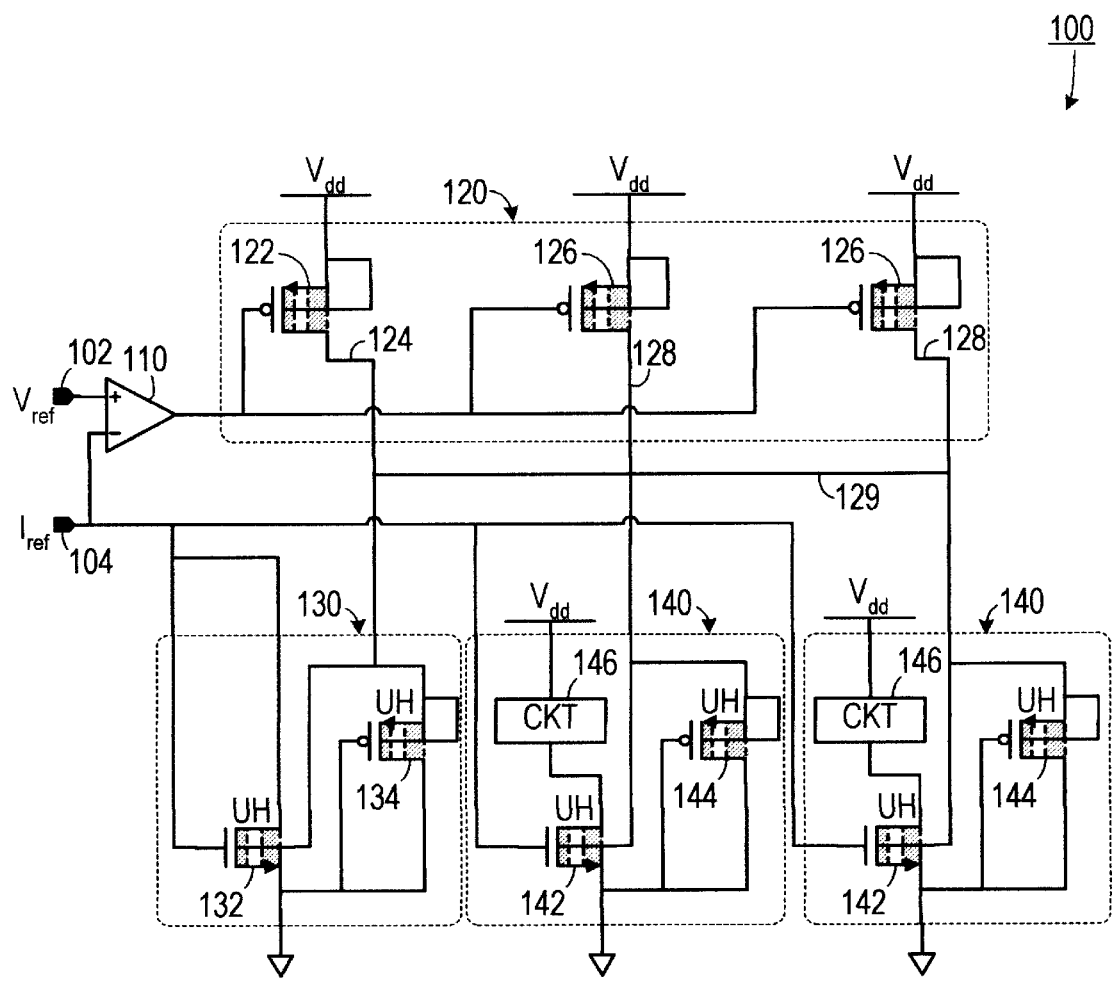
FIG. 1 is a schematic diagram of one embodiment of a body biasing circuit according to the invention.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a", "an," and "the" includes plural reference, the meaning of "in" includes "in" and "on."

In one illustrative embodiment of the invention, an operational amplifier (op-amp) has a positive input tied to a reference voltage that is equal to the desired gate-source (g-s) voltage for the SOI metal oxide silicon field effect transistors (MOSFETS). The negative op-amp input is tied to the gate drain (g-d) connection of a current source reference N-MOSFET. The reference current is driven into both the gate and drain of the reference device. If the gate-source voltage of the reference N-MOSFET is too high or too low, the output of the op-amp goes low or high, respectively, which raises or lowers the current in the biasing transistor. This correspondingly raises or lowers the g-s voltage of a body reference device, such as a passive P-MOSFET, which, due to the body effect, lowers or raises the g-s voltage on the reference N-MOSFET, thus closing the loop. Additional biasing P-MOSFETs track the current in the reference biasing P-MOSFET. This causes corresponding passive P-MOSFETs to track the current in the first passive P-MOSFET, thereby allowing the current mirrors formed by additional N-MOSFETs to track the reference N-MOSFET.

The body reference device may be a P-MOSFET. However, it can also be a diode or a resistor. In fact, no passive element reference device is needed, as the drains of the biasing transistors can be tied directly to the bodies of the corresponding N-MOSFETs. In such a case, the parasitic p/n-diodes between the channels and drains of the N-MOSFETS are used as the reference devices.

As shown in FIG. 1, one embodiment of the invention is an apparatus 100 for biasing a body voltage of silicon-on-insulator transistors 142 that are used, in this embodiment, in a current mirror. The current mirror includes a reference current source 130 and a plurality of mirrored current sources 140, each of which sources current for an electrical circuit 146. An operational amplifier 110 senses a voltage difference between the desired gate-source threshold reference voltage 102 and a reference voltage at a reference current source node 104 and generates an output voltage that is proportional to the voltage difference. A plurality of biasing transistors 120 have gates driven by the output of the operational amplifier 110 and source current that is in proportion to the output voltage.

The reference current source 130 maintains the voltage at the reference current source node 104, thereby providing feedback to the operational amplifier 110 and providing a common gate voltage to each of the silicon-on-insulator transistors 142 that are used in the mirrored current sources. The reference current source 130 includes a reference mirror transistor 132 that has both a gate and a drain that are electrically coupled to the current source node 104. The reference mirror transistor 132, which in this embodiment is an ultra-high threshold transistor, also has a body that is electrically coupled to the drain 124 of a reference biasing transistor 122. A p-channel transistor, which in this embodiment is an ultra-high threshold transistor, is biased as a passive device 134 that ensures that the voltage at the drain 124 of the reference biasing transistor 122 (which is also the voltage of the body of the reference mirror transistor 132) is maintained at a value that is proportional to the current sourced by the reference biasing transistor 122. This maintains the gate-source threshold voltage ($V_T$) of the reference mirror transistor 132 within a predetermined range of the desired gate-source threshold reference voltage 102.

Each of the SOI transistors 142 that are biased by the invention also have a body that is electrically coupled to the drain 128 of a biasing transistor 126. Optionally, the drains of the biasing transistors 122 and 126 may be coupled by a common node 129. P-channel transistors are also biased as a passive devices 144 in the mirrored current sources 140. These passive devices 144 work in the same way as the passive device 134 in the reference current source 130. Thus, passive devices 144 ensure that the voltage at the drains 128 of the biasing transistors 126 is maintained at the same value as that of the body of the reference mirror transistor 132, thereby maintaining the gate-source threshold voltage ($V_T$) of the silicon-on-insulator transistors 142 at the same $V_T$ as that of the reference mirror transistor 132.

The above described embodiments are given as illustrative examples only. It will be readily appreciated that many deviations may be made from the specific embodiments disclosed in this specification without departing from the invention. Accordingly, the scope of the invention is to be determined by the claims below rather than being limited to the specifically described embodiments above.

What is claimed is:

1. An apparatus for biasing a body voltage of a silicon-on-insulator transistor having a gate and a body, comprising:
   a. an operational amplifier that senses a voltage difference between a desired gate-source threshold voltage and a reference voltage at a reference current source node and that generates an output voltage that is proportional to the voltage difference;
   b. a reference biasing transistor that has a gate that is electrically coupled to the output voltage and that has a drain;
   c. a reference mirror transistor that has both a gate and a drain that are electrically coupled to the current source node, the reference mirror transistor also having a body that is electrically coupled to the drain of the reference biasing transistor, wherein the gate of the reference mirror transistor is electrically coupled to the gate of the silicon-on-insulator transistor;
   d. a device biasing transistor that has a gate that is electrically coupled to the output voltage and that has a drain that is electrically coupled to the body of the silicon-on-insulator transistor and that maintains a voltage at the body of the silicon-on-insulator transistor so that the silicon-on-insulator transistor has a gate-source threshold voltage that is within a predetermined range of the desired gate-source threshold voltage; and
   e. a body biasing element that electrically couples the body of the silicon-on-insulator transistor to a common node.

2. The apparatus of claim 4, wherein the reference biasing transistor comprises a silicon-on-insulator p-channel transistor.

3. The apparatus of claim 4, wherein the device biasing transistor comprises a silicon-on-insulator n-channel transistor.

4. An apparatus for biasing a device body so as to maintain a desired gate-source threshold voltage of a device having a device gate, a device source, a device drain and a device body, the device also having a device gate-source threshold voltage, the device being driven by a reference current from a reference current node, the reference current node having a reference voltage, the apparatus comprising:
   a. an operational amplifier having a first input and a second input, the first input electrically coupled to the desired gate-source threshold voltage, the second input electrically coupled to the reference current node, the operational amplifier capable of generating an output voltage that is proportional to a voltage difference between the desired gate-source threshold voltage and the reference voltage;
   b. at least two body biasing transistors, including a first body biasing transistor and a second body biasing transistor, each body biasing transistor having a biasing transistor drain and a biasing transistor gate that is driven by the output voltage of the operational amplifier, each body biasing transistor capable of supplying a body biasing current that is proportional to the output voltage, the biasing transistor drain of the second body biasing transistor being electrically coupled to the device body;
   c. a reference transistor, having a reference gate, a reference source, a reference drain and a reference body, the reference drain and the reference gate being electrically coupled to the reference current node, the reference body being electrically coupled to the body biasing drain of the first body biasing transistor;
   d. a first body biasing component, electrically coupled to the reference body, that causes the reference body to have a reference body voltage that is proportional to the body biasing current so that the reference voltage is within a predetermined range of the desired gate-source threshold voltage; and
   e. a second body biasing component, electrically coupled to the device body, that causes the body to have a body voltage that is proportional to the body biasing current so that the device gate-source threshold voltage is within the predetermined range of the desired gate-source threshold voltage.

5. The apparatus of claim 4, wherein the device comprises a silicon-on-insulator field effect transistor.

6. The apparatus of claim 4, wherein the body biasing transistor comprises a p-channel-type silicon-on-insulator field effect transistor.

7. The apparatus of claim 4, wherein the body biasing component comprises a p-channel-type silicon-on-insulator field effect transistor having a body biasing component gate, a body biasing component drain and a body biasing component source, the body biasing component gate being electrically coupled to the body biasing component drain and the body biasing component source being electrically coupled to a corresponding body biasing drain.

8. The apparatus of claim 5, wherein the body biasing component comprises an n-channel-type silicon-on-insulator field effect transistor having a body biasing component gate, a body biasing component drain and a body biasing component source, the body biasing component gate being electrically coupled to the body biasing component source and the body biasing component drain being electrically coupled to a corresponding body biasing drain.

9. The apparatus of claim 4, wherein the body biasing component comprises a resistor electrically coupling the device body to the device source.

10. The apparatus of claim 4, wherein the body biasing component comprises a diode electrically coupling the device body to the device source.

11. The apparatus of claim 5, wherein the device comprises a mirrored current source.

12. The apparatus of claim 11, further comprising a plurality of mirrored current sources and a corresponding plurality of biasing transistors, each biasing transistor having a gate driven by the output of the operational amplifier.

* * * * *